(12) United States Patent
Li

(10) Patent No.: US 9,532,137 B2
(45) Date of Patent: Dec. 27, 2016

(54) METHOD AND DEVICE FOR MATCHING WITH AUDIO INTERFACE OF MOBILE TERMINAL, AND ELECTRONIC SIGNATURE TOKEN

(71) Applicant: Tendyron Corporation, Beijing (CN)

(72) Inventor: Dongsheng Li, Beijing (CN)

(73) Assignee: Tendyron Corporation (CN)

( * ) Notice: Subject to any disclaimer, the term of this patent is extended or adjusted under 35 U.S.C. 154(b) by 87 days.

(21) Appl. No.: 14/407,802

(22) PCT Filed: Jun. 9, 2013

(86) PCT No.: PCT/CN2013/077104
§ 371 (c)(1),
(2) Date: Dec. 12, 2014

(87) PCT Pub. No.: WO2013/185600
PCT Pub. Date: Dec. 19, 2013

(65) Prior Publication Data
US 2015/0156586 A1 Jun. 4, 2015

(30) Foreign Application Priority Data
Jun. 13, 2012 (CN) .......................... 2012 1 0195023

(51) Int. Cl.
*H04R 3/00* (2006.01)
*H03H 7/38* (2006.01)
(Continued)

(52) U.S. Cl.
CPC .................. *H04R 3/00* (2013.01); *H03H 7/38* (2013.01); *H04R 1/1025* (2013.01);
(Continued)

(58) Field of Classification Search
None
See application file for complete search history.

(56) References Cited

U.S. PATENT DOCUMENTS

2007/0049103 A1  3/2007  Kashi et al.
2009/0254842 A1* 10/2009  Leacock ............. H04L 12/1827
715/757

(Continued)

FOREIGN PATENT DOCUMENTS

CN       102201827 A      9/2011
CN       102404665 A      4/2012
(Continued)

OTHER PUBLICATIONS

International Search Report and Written Opinion for Application No. PCT/CN2013/077104 dated Sep. 19, 2013.

*Primary Examiner* — Curtis Kuntz
*Assistant Examiner* — Kenny Truong
(74) *Attorney, Agent, or Firm* — Lerner, David, Littenberg, Krumholz & Mentlik, LLP

(57) ABSTRACT

A method for matching with an audio interface of a mobile terminal includes: connecting a third pin with a first pin of the audio interface via a first circuit including a first unidirectional conduction module having a current direction flowing towards the first pin; connecting the third pin with a second pin of the audio interface via a second circuit including a second unidirectional conduction module having a current direction flowing towards the second pin; controlling the first unidirectional conduction module to turn on such that the third pin and the first pin form a first loop having an impedance matched with an identification resistance of the mobile terminal; and, controlling the second unidirectional conduction module to turn on such that the third pin and the second pin form a second loop having an impedance matched with the identification resistance of the mobile terminal.

20 Claims, 7 Drawing Sheets

(51) Int. Cl.
  *H04R 1/10*    (2006.01)
  *H04R 29/00*   (2006.01)
  *H04M 1/725*   (2006.01)
(52) U.S. Cl.
  CPC ....... *H04R 29/001* (2013.01); *H04M 1/72527* (2013.01); *H04R 1/1091* (2013.01)

(56) References Cited

U.S. PATENT DOCUMENTS

| | | |
|---|---|---|
| 2010/0260341 A1 | 10/2010 | Sander et al. |
| 2012/0328116 A1* | 12/2012 | Bidmead .............. H04R 29/004 381/59 |
| 2013/0092843 A1* | 4/2013 | Turqueti .................. G01T 7/00 250/369 |
| 2014/0198928 A1 | 7/2014 | Li |

FOREIGN PATENT DOCUMENTS

| | | |
|---|---|---|
| CN | 102739183 A | 10/2012 |
| CN | 202721651 U | 2/2013 |

\* cited by examiner

METHOD AND DEVICE FOR MATCHING WITH AUDIO INTERFACE OF MOBILE TERMINAL, AND ELECTRONIC SIGNATURE TOKEN

CROSS-REFERENCE TO RELATED APPLICATIONS

The present application is a national phase entry under 35 U.S.C. §371 of International Application No. PCT/CN2013/077104 filed Jun. 9, 2013, which claims priority from Chinese Patent Application No. 201210195023.3 filed Jun. 13, 2012.

FIELD

The present disclosure relates to an electronic technique field, and more particularly relates to a method and a device for matching with an audio interface of a mobile terminal, and an electronic signature token.

BACKGROUND

An audio signal transmission between an audio interface (e.g., a headphone jack) of a conventional audio signal sending apparatus (e.g., a mobile terminal) and an audio interface of a conventional audio signal receiving apparatus (e.g., a headphone) is generally performed as a single channel transmission or a multichannel transmission, in which a third pin is used as a single-channel audio output pin, or the third pin and a fourth pin are used as multichannel audio output pins, i.e. a left channel pin and a right channel pin. However, the first pin and the second pin of different audio interfaces perform different functions, i.e. there are two types of audio interfaces: one type of audio interface having a first pin as a microphone pin (MIC pin) and a second pin as a ground pin (GND pin), and the other type of audio interface having a first pin as a ground pin (GND pin) and a second pin as a microphone pin (MIC pin).

Due to different types of audio interfaces, when an audio interface of an audio signal sending apparatus (e.g., a mobile terminal) is not matched with an audio interface of an audio signal receiving apparatus (e.g., a headphone, a headset, or an electronic signature token), it is impossible to perform the communication between the audio signal sending apparatus and the audio signal receiving apparatus via microphone pins of the audio interfaces, or to perform the audio signal transmission between the audio signal sending apparatus and the audio signal receiving apparatus via audio output pins (i.e. left channel pins and right channel pins) of the audio interfaces normally.

With the continuous advance of mobile internet technology, the capability of the mobile terminal becomes more and more powerful, and therefore the demand for mobile payment becomes more and more urgent. However, due to the small volume of the mobile terminal, the number of external interfaces is very small, so how to connect the electronic signature token and the mobile terminal has become a serious problem. Especially since there are different types of audio interfaces of the mobile terminal, the successful connection between the mobile terminal and the electronic signature token is hindered. In particular, since the types of audio interfaces of the mobile terminal are various, after inserted into the audio interfaces of the mobile terminal, the electronic signature token may not be identified, so that it is impossible to establish the communication between the electronic signature token and the audio interfaces of the mobile terminal.

SUMMARY

Embodiments of the present disclosure seek to solve at least one of the above-identified problems.

Accordingly, an objective of the present disclosure is to provide a method for matching with an audio interface of a mobile terminal.

Another objective of the present disclosure is to provide a device for matching with an audio interface of a mobile terminal.

Yet another objective of the present disclosure is to provide an electronic signature token.

In order to achieve the above objectives, embodiments of a first aspect of the present disclosure provide a method for matching with an audio interface of a mobile terminal. The audio interface of the mobile terminal comprises a first pin, a second pin and a third pin. The first pin is one of a microphone pin and a ground pin, and the second pin is the other one of the microphone pin and the ground pin. The third pin is a single-channel audio output pin or one of multichannel audio output pins. The method comprises the following steps: connecting the third pin with the first pin via a first circuit, where the first circuit comprises a first unidirectional conduction module having a current direction of flowing to the first pin; connecting the third pin with the second pin via a second circuit, where the second circuit comprises a second unidirectional conduction module having a current direction of flowing to the second pin; controlling the first unidirectional conduction module to turn on such that the third pin and the first pin form a first loop having an impedance matched with an identification resistance of the mobile terminal; and controlling the second unidirectional conduction module to turn on such that the third pin and the second pin form a second loop having an impedance matched with the identification resistance of the mobile terminal.

Furthermore, the method further comprises the following steps: connecting the third pin with the first circuit and the second circuit respectively via a first matching circuit; controlling the first unidirectional conduction module to turn on such that the third pin and the first pin form a third loop having an impedance matched with the identification resistance of the mobile terminal; and controlling the second unidirectional conduction module to turn on such that the third pin and the second pin form a fourth loop having an impedance matched with the identification resistance of the mobile terminal.

Furthermore, the audio interface further comprises a fourth pin being the other one of the multichannel audio output pins, and the method further comprises: connecting the fourth pin with the first pin via a third circuit, where the third circuit comprises a third unidirectional conduction module having a current direction of flowing to the first pin; connecting the fourth pin with the second pin via a fourth circuit, where the fourth circuit comprises a fourth unidirectional conduction module having a current direction of flowing to the second pin; controlling the third unidirectional conduction module to turn on such that the fourth pin and the first pin form a fifth loop having an impedance matched with the identification resistance of the mobile terminal; and controlling the fourth unidirectional conduction module to turn on such that the fourth pin and the second pin form a sixth loop having an impedance matched with the identification resistance of the mobile terminal.

Furthermore, the audio interface further comprises a fourth pin being the other one of the multichannel audio output pins, and the method further comprises: connecting the fourth pin with the first circuit and the second circuit respectively via a second matching circuit; controlling the first unidirectional conduction module to turn on such that the fourth pin and the first pin form a seventh loop having an impedance matched with the identification resistance of the mobile terminal, and such that the third pin and the first pin form an eighth loop having an impedance matched with the identification resistance of the mobile terminal; and controlling the second unidirectional conduction module to turn on such that the fourth pin and the second pin form a ninth loop having an impedance matched with the identification resistance of the mobile terminal, and such that the third pin and the second pin form an tenth loop having an impedance matched with the identification resistance of the mobile terminal.

Furthermore, each of the first matching circuit and the second matching circuit comprises a resistor, a loudspeaker, a transformer, a resistor and a comparator connected in parallel, or a resistor and an operational amplifier connected in parallel.

Furthermore, each of the first unidirectional conduction module, the second unidirectional conduction module, the third unidirectional conduction module and the fourth unidirectional conduction module comprises a diode, a triode or a MOS transistor.

Furthermore, the first circuit further comprises a first matching module connected with the first unidirectional conduction module, the second circuit further comprises a second matching module connected with the second unidirectional conduction module, the third circuit further comprises a third matching module connected with the third unidirectional conduction module, and the fourth circuit further comprises a fourth matching module connected with the fourth unidirectional conduction module.

Furthermore, each of the first matching module, the second matching module, the third matching module and the fourth matching module comprises a resistor, a loudspeaker, a transformer, a resistor and a comparator connected in parallel, or a resistor and an operational amplifier connected in parallel.

Furthermore, the first pin and the second pin of the audio interface are connected via a bidirectional conduction element.

Embodiments of a second aspect of the present disclosure provide a device for matching with an audio interface of a mobile terminal. The device comprises: an audio interface comprising a first pin, a second pin and a third pin, the third pin being a single-channel audio output pin or one of multichannel audio output pins, the first pin being one of a microphone pin and a ground pin, and the second pin being the other one of the microphone pin and the ground pin; a first circuit via which the third pin and the first pin are connected, the first circuit comprising a first unidirectional conduction module; and a second circuit via which the third pin and the second pin are connected, the second circuit comprising a second unidirectional conduction module. A current direction of the first unidirectional conduction module is to flow to the first pin, and a current direction of the second unidirectional conduction module is to flow to the second pin. When the first unidirectional conduction module is turned on, a first loop is formed by the third pin and the first pin, and the first loop has an impedance matched with an identification resistance of the mobile terminal. When the second unidirectional conduction module is turned on, a second loop is formed by the third pin and the second pin, and the second loop has an impedance matched with the identification resistance of the mobile terminal.

Furthermore, the device further comprises a first matching circuit via which the third pin is connected with the first circuit and the second circuit respectively. When the first unidirectional conduction module is turned on, a third loop is formed by the third pin and the first pin, and the third loop has an impedance matched with the identification resistance of the mobile terminal. When the second unidirectional conduction module is turned on, a fourth loop is formed by the third pin and the second pin, and the fourth loop has an impedance matched with the identification resistance of the mobile terminal.

Furthermore, the audio interface further comprises a fourth pin being the other one of the multichannel audio output pins, and the device further comprises: a third circuit via which the fourth pin and the first pin are connected, the third circuit comprising a third unidirectional conduction module; and a fourth circuit via which the fourth pin and the second pin are connected, the fourth circuit comprising a fourth unidirectional conduction module. A current direction of the third unidirectional conduction module is to flow to the first pin, and a current direction of the fourth unidirectional conduction module is to flow to the second pin. When the third unidirectional conduction module is turned on, a fifth loop is formed by the fourth pin and the first pin, and the fifth loop has an impedance matched with the identification resistance of the mobile terminal. When the fourth unidirectional conduction module is turned on, a sixth loop is formed by the fourth pin and the second pin, and the sixth loop has an impedance matched with the identification resistance of the mobile terminal.

Furthermore, the audio interface further comprises a fourth pin being the other one of the multichannel audio output pins, and the device further comprises: a second matching circuit via which the fourth pin is connected with the first circuit and the second circuit respectively. When the first unidirectional conduction module is turned on, a seventh loop is formed by the fourth pin and the first pin, an eighth loop is formed by the third pin and the first pin, the seventh loop has an impedance matched with the identification resistance of the mobile terminal, and the eighth loop has an impedance matched with the identification resistance of the mobile terminal. When the second unidirectional conduction module is turned on, a ninth loop is formed by the fourth pin and the second pin, an tenth loop is formed by the third pin and the second pin, the ninth loop has an impedance matched with the identification resistance of the mobile terminal, and the tenth loop has an impedance matched with the identification resistance of the mobile terminal.

Furthermore, each of the first matching circuit and the second matching circuit comprises a resistor, a loudspeaker, a transformer, a resistor and a comparator connected in parallel, or a resistor and an operational amplifier connected in parallel.

Furthermore, each of the first unidirectional conduction module, the second unidirectional conduction module, the third unidirectional conduction module and the fourth unidirectional conduction module comprises a diode, a triode or a MOS transistor.

Furthermore, the first circuit further comprises a first matching module connected with the first unidirectional conduction module, the second circuit further comprises a second matching module connected with the second unidirectional conduction module, the third circuit further comprises a third matching module connected with the third unidirectional conduction module, and the fourth circuit further comprises a fourth matching module connected with the fourth unidirectional conduction module.

Furthermore, each of the first matching module, the second matching module, the third matching module and the fourth matching module comprises a resistor, a loudspeaker, a transformer, a resistor and a comparator connected in parallel, or a resistor and an operational amplifier connected in parallel.

Furthermore, the first pin and the second pin of the audio interface are connected via a bidirectional conduction element.

Embodiments of a third aspect of the present disclosure provide an electronic signature token comprising the abovementioned device for matching with an audio interface of a mobile terminal.

With the method and device for matching with an audio interface of a mobile terminal and the electronic signature token according to embodiments of the present disclosure, the impedance of a loop formed by an audio output pin (i.e. a single-channel audio output pin, or a multichannel left channel pin and/or a multichannel right channel pin) and a ground pin of the audio interface may be matched with the identification resistance of the mobile terminal, thereby ensuring that the mobile terminal may transmit an audio signal to an audio signal receiving apparatus.

Meanwhile, with the technical solution according to embodiments of the present disclosure, the electronic signature token may be correctly identified by the mobile terminal, thus ensuring the successful connection between the mobile terminal and the electronic signature token.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions of embodiments made with reference to the drawings, in which.

DETAILED DESCRIPTION

Figure 1:
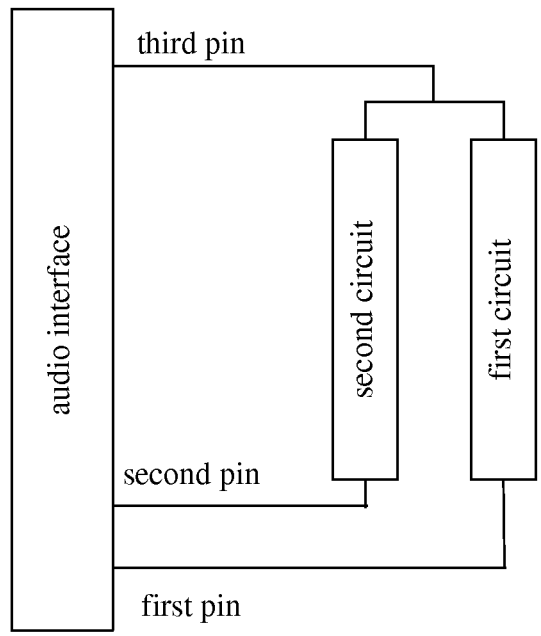
FIG. 1 is a first schematic diagram of a device for matching with an audio interface of a mobile terminal according to Embodiment 1 of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, unless specified or limited otherwise, relative terms such as "central", "longitudinal", "lateral", "upper", "lower", "front", "rear", "left", "right", "vertical", "horizontal", "top", "bottom," "inner", "outer" should be construed to refer to the orientation as then described or as shown in the drawings under discussion. These relative terms are for convenience of description and do not require that the present disclosure be constructed or operated in a particular orientation, and thus shall not be construed to limit the present disclosure. In addition, terms such as "first" and "second" are used herein for purposes of description and are not intended to indicate or imply relative importance or significance or to imply the number or position of indicated technical features. Further, terms such as "first pin" and "second pin" are used to distinguish pins, but are not used to define the position of pins.

In the present disclosure, unless specified or limited otherwise, the terms "mounted," "connected," "coupled," and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

First, a device for matching an audio interface of a mobile terminal according to embodiments of the present disclosure will be described below with reference to the drawings.

In the device for matching with the audio interface of the mobile terminal according to embodiments of the present disclosure, the audio interface of the mobile terminal comprises a first pin, a second pin, a third pin, and a fourth pin. In a specific example of the present disclosure, the third pin and the fourth pin of the audio interface are defined as follows: the third pin of the audio interface is one of audio output pins, i.e. one of a left channel output pin and a right channel output pin; and the fourth pin of the audio interface is the other one of the audio output pins, i.e. the other one of the left channel output pin and the right channel output pin. The first pin is one of a microphone pin MIC and a ground pin GND, and the second pin is the other one of the microphone pin MIC and the ground pin GND.

Embodiment 1

FIG. 1 is a schematic diagram of a device for matching with an audio interface of a mobile terminal according to Embodiment 1 of the present disclosure. Referring to FIG. 1, the device for matching with the audio interface of the mobile terminal comprises an audio interface, a first circuit and a second circuit.

A third pin of the audio interface is connected with the first pin via the first circuit, the third pin is connected with the second pin via the second circuit. The third pin is a single-channel audio output pin or one of multichannel audio output pins.

The first circuit comprises a first unidirectional conduction module, and the second circuit comprises a second unidirectional conduction module. A current direction of the first unidirectional conduction module is to flow to the first pin, and a current direction of the second unidirectional conduction module is to flow to the second pin. When the first unidirectional conduction module is turned on, the third pin and the first pin form a loop, and the loop has an impedance matched with an identification resistance of the mobile terminal. When the second unidirectional conduction module is turned on, the third pin and the second pin form a loop, and the loop has an impedance matched with the identification resistance of the mobile terminal.

In some embodiments of the present disclosure, the identification resistance of the mobile terminal is generally 8 ohms, 16 ohms, or 32 ohms.

Since the impedance of a loop formed by an audio output pin (i.e. a single-channel pin, a left channel pin and/or a right channel pin of the multichannel audio output pins) and a ground pin of the audio interface may be matched with the identification resistance of the mobile terminal, an audio signal may be transmitted to the audio signal receiving apparatus from the mobile terminal.

Thus it can be seen that, the audio signal receiving apparatus (e.g., a headphone, a headset, or an electronic signature token) may be connected with any type of audio interface of the mobile terminal, be detected successfully by the mobile terminal, and receive an audio signal normally via an audio signal output pin (a single-channel pin, or a left channel pin and/or a right channel pin of the multichannel audio output pins) of the audio interface.

Each of the first unidirectional conduction module and the second unidirectional conduction module comprises but is not limited to: a diode, a triode or a MOS transistor. For example, when the first unidirectional conduction module is a diode, a positive terminal of the diode is connected with the third pin, and a negative terminal of the diode is connected with the first pin.

Certainly, the first circuit may further comprise a first matching module connected with the first unidirectional conduction module, and the second circuit may further comprise a second matching module connected with the second unidirectional conduction module.

Each of the first matching module and the second matching module may be configured as a resistor, a loudspeaker, a transformer, a resistor and a comparator connected in parallel, or a resistor and an operational amplifier connected in parallel.

Figure 2:
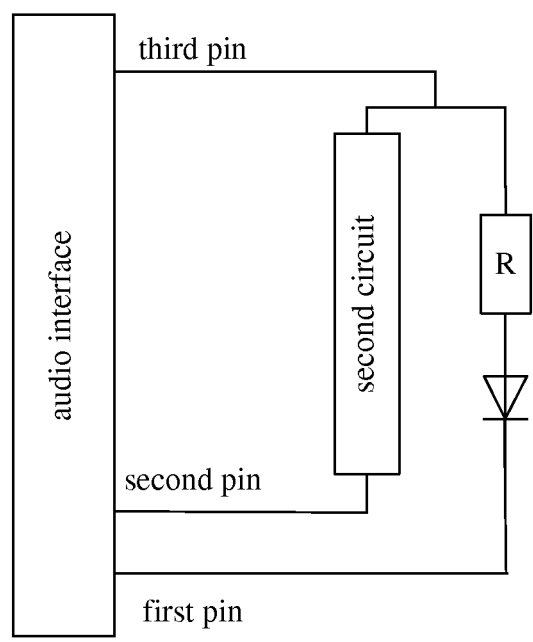
FIG. 2 is a second schematic diagram of the device for matching with the audio interface of the mobile terminal according to Embodiment 1 of the present disclosure.

Referring to FIG. 2, the first circuit comprises a first matching module and a unidirectional conduction module connected in turn, the first matching module is a resistor, and the unidirectional conduction module is a diode.

Figure 3:
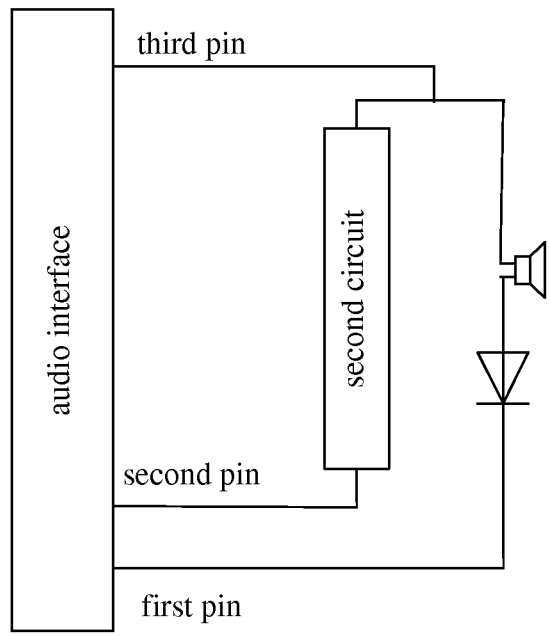
FIG. 3 is a third schematic diagram of the device for matching with the audio interface of the mobile terminal according to Embodiment 1 of the present disclosure.

Referring to FIG. 3, the matching module is a loudspeaker, and the unidirectional conduction module is a diode.

Figure 4:
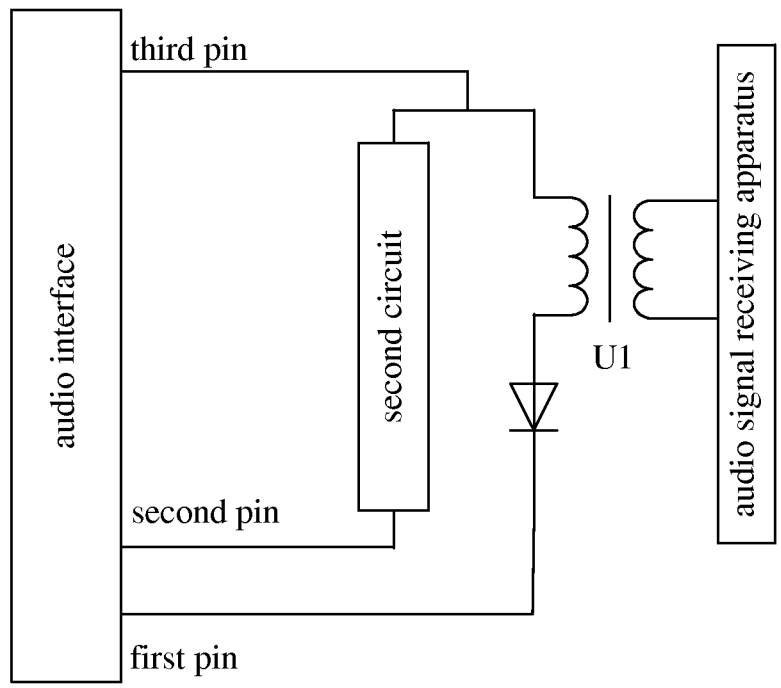
FIG. 4 is a fourth schematic diagram of the device for matching with the audio interface of the mobile terminal according to Embodiment 1 of the present disclosure.

Referring to FIG. 4, the matching module is a transformer, and the unidirectional conduction module is a diode.

Figure 5:
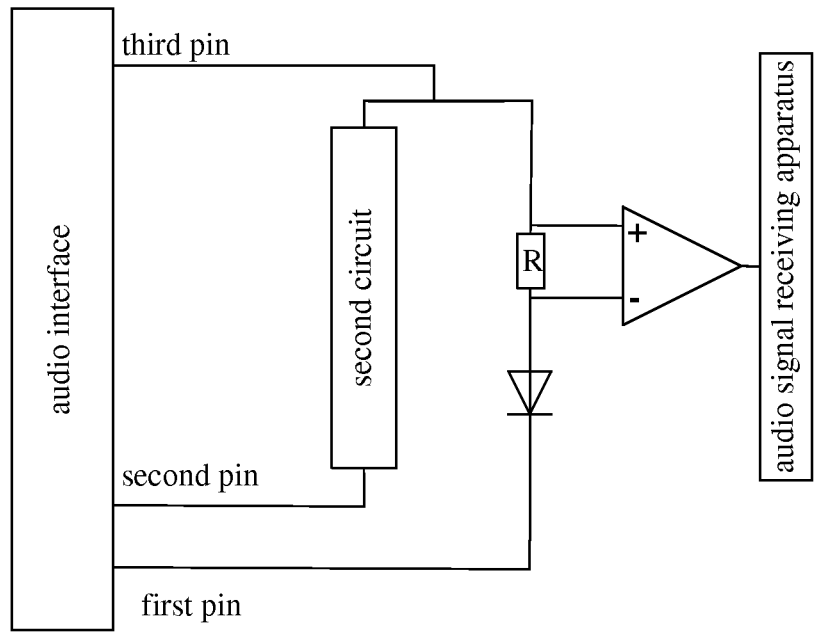
FIG. 5 is a fifth schematic diagram of the device for matching with the audio interface of the mobile terminal according to Embodiment 1 of the present disclosure.

Referring to FIG. 5, the matching module is a resistor and a comparator connected in parallel, and the unidirectional conduction module is a diode. The comparator may also be replaced with an operational amplifier.

Figure 6:
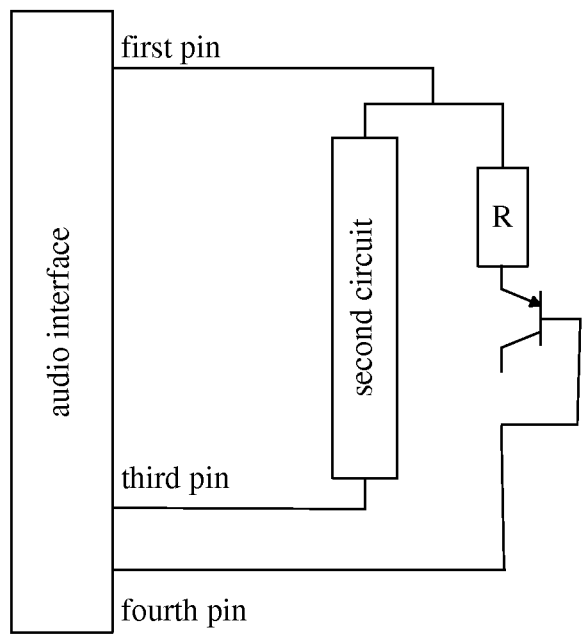
FIG. 6 is a sixth schematic diagram of the device for matching with the audio interface of the mobile terminal according to Embodiment 1 of the present disclosure.

Referring to FIG. 6, the matching module is any one of the circuits shown in FIGS. 2-5, and the unidirectional conduction module is a PNP type triode.

Figure 7:
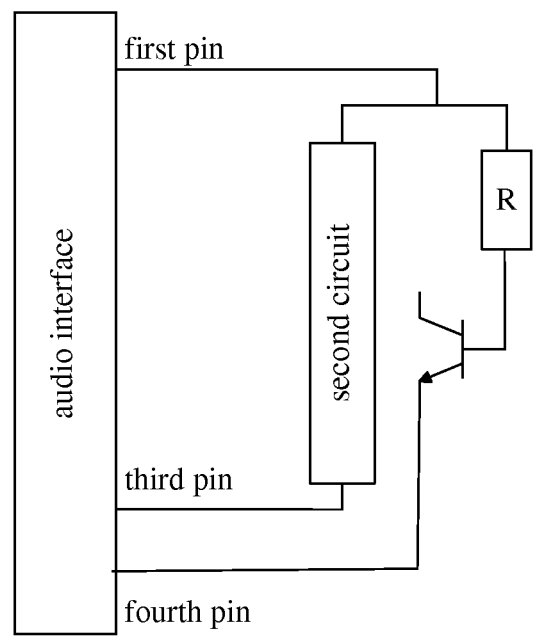
FIG. 7 is a seventh schematic diagram of the device for matching with the audio interface of the mobile terminal according to Embodiment 1 of the present disclosure.

Referring to FIG. 7, the matching module is any one of the circuits shown in FIGS. 2-5, and the unidirectional conduction module is an NPN type triode.

Figure 8:
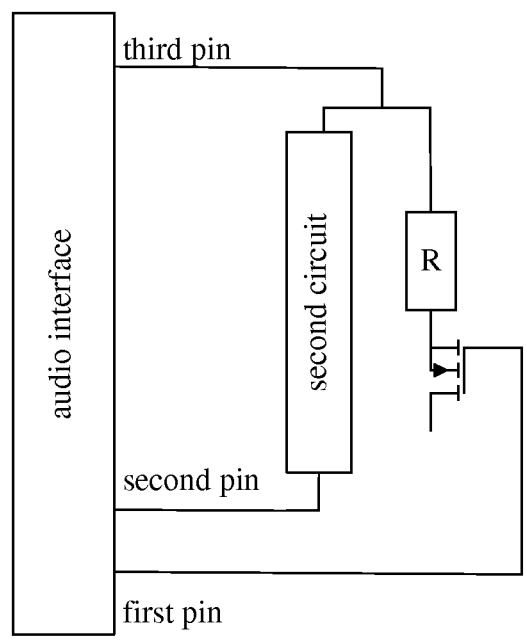
FIG. 8 is an eighth schematic diagram of the device for matching with the audio interface of the mobile terminal according to Embodiment 1 of the present disclosure.

Referring to FIG. 8, the matching module is any one of the circuits shown in FIGS. 2-5, and the unidirectional conduction module is an N-channel MOS transistor.

Figure 9:
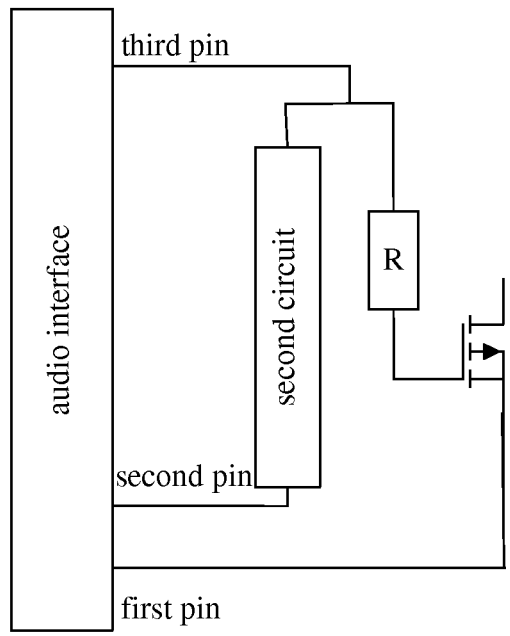
FIG. 9 is a ninth schematic diagram of the device for matching with the audio interface of the mobile terminal according to Embodiment 1 of the present disclosure.

Referring to FIG. 9, the matching module is any one of the circuits shown in FIGS. 2-5, and the unidirectional conduction module is a P-channel MOS transistor.

Certainly, the matching module and the unidirectional conduction module connected in turn in the first circuit may be exchanged.

Certainly, the second circuit may be the same as the first circuit, or may be a circuit different from the second circuit. For example, the first circuit uses a resistor and a diode to perform a unidirectional conduction function, while the second circuit uses a loudspeaker and a triode to perform a unidirectional conduction function.

Embodiment 2

Figure 10:
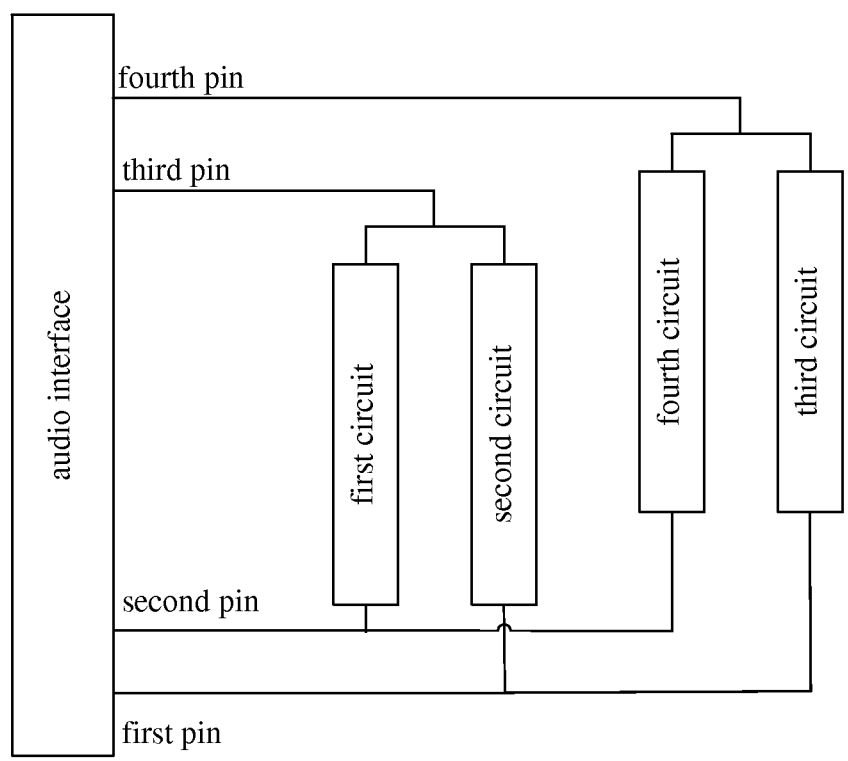
FIG. 10 is a schematic diagram of a device for matching with an audio interface of a mobile terminal according to Embodiment 2 of the present disclosure.

FIG. 10 is a schematic diagram of a device for matching with an audio interface of a mobile terminal according to Embodiment 2 of the present disclosure. Referring to FIG. 10, in the device for matching with the audio interface of the mobile terminal according to the present embodiment, a fourth pin and a first pin of the audio interface are connected via a third circuit, and the fourth pin and a second pin are connected via a fourth circuit, in which the fourth pin is the other one of the multichannel audio output pins.

The third circuit comprises a third unidirectional conduction module, and the fourth circuit comprises a fourth unidirectional conduction module. A current direction of the third unidirectional conduction module is to flow to the first pin, and a current direction of the fourth unidirectional conduction module is to flow to the second pin. When the third unidirectional conduction module is turned on, the fourth pin and the first pin form a loop, and the loop has an impedance matched with the identification resistance of the mobile terminal. When the fourth unidirectional conduction module is turned on, the fourth pin and the second pin form a loop, and the loop has an impedance matched with the identification resistance of the mobile terminal.

Since an audio signal sent from the mobile terminal to an audio signal receiving apparatus may be transmitted only by one circuit, the third pin or the fourth pin may be used selectively to perform the transmission.

Each of the third unidirectional conduction module and the fourth unidirectional conduction module comprises but is not limited to: a diode, a triode or a MOS transistor. For example, when the third unidirectional conduction module is a diode, a positive terminal of the diode is connected with the fourth pin, and a negative terminal of the diode is connected with the second pin.

Certainly, the third circuit may further comprise a third matching module connected with the third unidirectional conduction module, and the fourth circuit may further comprise a fourth matching module connected with the fourth unidirectional conduction module.

Certainly, structures of the third circuit and the fourth circuit in the present embodiment may be the same with that of the first circuit in Embodiment 1. The structures of the third circuit and the fourth circuit may be same as or different from each other so as to perform a unidirectional conduction function.

Embodiment 3

Figure 11:
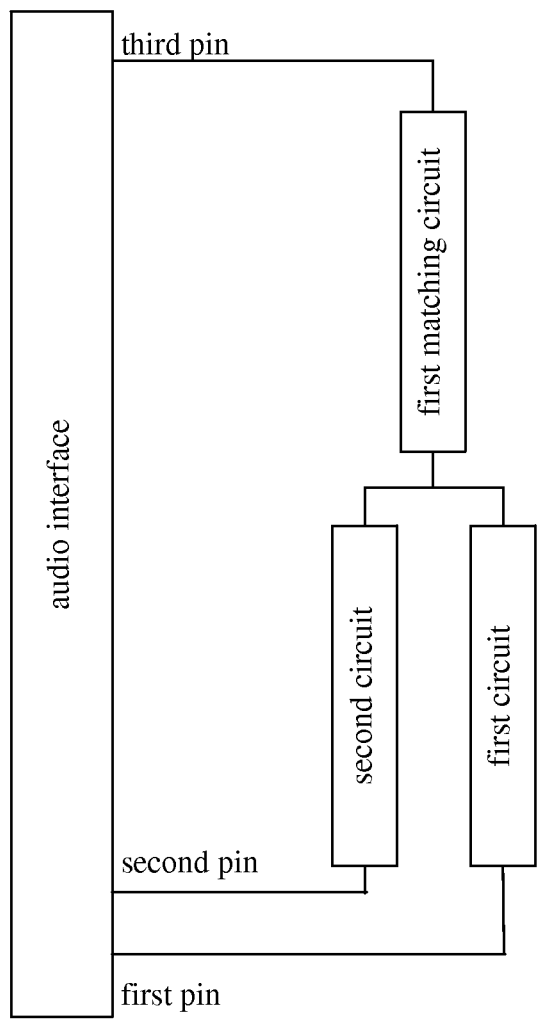
FIG. 11 is a schematic diagram of a device for matching with an audio interface of a mobile terminal according to Embodiment 3 of the present disclosure.

FIG. 11 is a schematic diagram of a device for matching with an audio interface of a mobile terminal according to Embodiment 3 of the present disclosure. Referring to FIG. 11, the present embodiment differs from Embodiment 1 in that, the device for matching with the audio interface of the mobile terminal according to the present embodiment further comprises a first matching circuit.

The third pin of the audio interface is connected with the first circuit and the second circuit respectively via the first matching circuit. The third pin is a single-channel audio output pin or one of multichannel audio output pins.

When the first unidirectional conduction module is turned on, a loop is formed by the third pin and the first pin, and the loop has an impedance matched with the identification resistance of the mobile terminal. When the second unidirectional conduction module is turned on, a loop is formed by the third pin and the second pin, and the loop has an impedance matched with the identification resistance of the mobile terminal.

With the matching circuit, in cases the first circuit or the second circuit cannot reach the identification resistance of the mobile terminal, it is further ensured that the combination of the matching circuit and the first circuit or the second circuit may match the identification resistance of the mobile terminal.

The first matching circuit may be achieved by follows: a resistor, a loudspeaker, a transformer, a resistor and a comparator connected in parallel, or a resistor and an operational amplifier connected in parallel.

Embodiment 4

Figure 12:
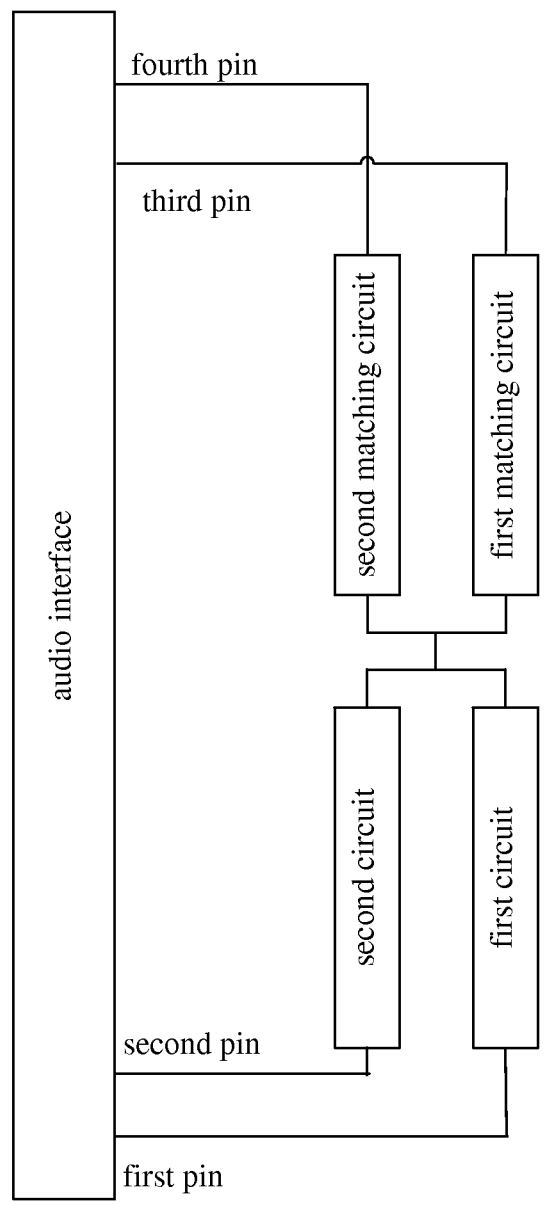
FIG. 12 is a schematic diagram of a device for matching with an audio interface of a mobile terminal according to Embodiment 4 of the present disclosure.

FIG. 12 is a schematic diagram of a device for matching an audio interface of a mobile terminal according to Embodiment 4 of the present disclosure. Referring to FIG. 12, in addition to those shown in Embodiment 3, the fourth pin of the audio interface is connected with the first circuit and the second circuit respectively via a second matching circuit, and the fourth pin is the other one of the multichannel audio output pins.

With the matching circuit, in cases the first circuit or the second circuit cannot reach the identification resistance, it is further ensured that the combination of the matching circuit and the first circuit or the second circuit may match the identification resistance of the mobile terminal.

In the present embodiment, the second matching circuit may be achieved by follows: a resistor, a loudspeaker, a transformer, a resistor and a comparator connected in parallel, or a resistor and an operational amplifier connected in parallel.

Certainly, the first matching circuit and the second matching circuit may be different from each other. Preferably, the first matching circuit and the second matching circuit have the same impedance. In cases when the third pin and the fourth pin are used together to transmit an audio signal, it is ensured that the mobile terminal may identify the audio signal receiving apparatus (e.g., a headphone, a headset, or an electronic signature token) connected with the audio interface of the mobile terminal.

Further, alternatively, the first pin and the second pin according to embodiments of the present disclosure may be connected with each other via a bidirectional conduction element, such as a resistor R. The resistance of the bidirectional conduction element may range from 7.7 K$\Omega$ to 15 K$\Omega$, generally may be 10 K$\Omega$, 12 K$\Omega$, or 15 K$\Omega$.

If the first pin and the second pin are connected with each other via the bidirectional conductive element such as a resistor, the audio signal receiving apparatus according to embodiments of the present disclosure may successfully pass the detection and identification of the mobile terminal for the microphone pin.

Certainly, in the above embodiments of the present disclosure, the audio interface may be any type of four-section headphone plug or jack, for example, a headphone plug having a diameter of 3.5 mm or 2.5 mm or a headphone jack having a diameter of 3.5 mm or 2.5 mm.

In the above embodiments of the present disclosure, the unidirectional conduction module uses a diode made of Ge.

In the above embodiments of the present disclosure, the unidirectional conduction modules may be integrated in a single chip, such as a single chip of BAT54 series.

In the above embodiments of the present disclosure, if the audio interface is a headphone plug, an audio signal receiving apparatus according to embodiments of the present disclosure may be directly inserted into a headphone jack of an audio signal sending apparatus (e.g., a smart phone). If the audio interface is a headphone jack, it may be connected with the headphone jack of smart phone via an adapter cable having two headphone plugs at two ends thereof.

In the above embodiments of the present disclosure, the audio signal receiving apparatus using the device for matching with an audio interface of a mobile terminal may be a headphone, a headset, or an electronic signature token.

The mobile terminal may be a mobile phone.

It can be seen from the above embodiments of the present disclosure, when an audio signal receiving apparatus of the device for matching with an audio interface of a mobile terminal according to embodiments of the present disclosure is connected with a mobile terminal, no matter what types of pins the first pin and the second pin of the audio interface of the mobile terminal are, the audio signal receiving apparatus may successfully pass a detection and an identification of a sending apparatus of the mobile terminal on the single-channel audio output pin and the multichannel third pin and/or fourth pin, and the audio output pin may be used to receive or process audio signals normally.

Embodiment 5

Embodiments of the present disclosure further provide a method for matching with an audio interface of a mobile terminal.

The method comprises the following steps:

connecting the third pin with the first pin via a first circuit, where the first circuit comprises a first unidirectional conduction module having a current direction of flowing to the first pin;

connecting the third pin with the second pin via a second circuit, where the second circuit comprises a second unidirectional conduction module having a current direction of flowing to the second pin;

controlling the first unidirectional conduction module to turn on such that the third pin and the first pin form a loop having an impedance matched with an identification resistance of the mobile terminal; and controlling the second unidirectional conduction module to turn on such that the third pin and the second pin form a loop having an impedance matched with the identification resistance of the mobile terminal.

The third pin is a single-channel audio output pin or one of multichannel audio output pins, the first pin is one of a microphone pin and a ground pin, and the second pin is the other one of the microphone pin and the ground pin.

Further, based on the above steps, the method comprises:

connecting the fourth pin with the first pin via a third circuit, where the third circuit comprises a third unidirectional conduction module having a current direction of flowing to the first pin;

connecting the fourth pin with the second pin via a fourth circuit, where the fourth circuit comprises a fourth unidirectional conduction module having a current direction of flowing to the second pin;

controlling the third unidirectional conduction module to turn on such that the fourth pin and the first pin form a loop having an impedance matched with the identification resistance of the mobile terminal; and controlling the fourth unidirectional conduction module to turn on such that the fourth pin and the second pin form a loop having an impedance matched with the identification resistance of the mobile terminal.

The fourth pin is the other one of the multichannel audio output pins.

Certainly, in the present embodiment, the third pin may be connected with the first circuit and the second circuit respectively via a first matching circuit. When the first unidirectional conduction module is turned on, the third pin and the first pin form a loop having an impedance matched with the identification resistance of the mobile terminal. When the second unidirectional conduction module is turned on, the third pin and the second pin form a loop having an impedance matched with the identification resistance of the mobile terminal.

Certainly, in the present embodiment, the fourth pin may be connected with the first circuit and the second circuit respectively via a second matching circuit. When the first unidirectional conduction module is turned on, the fourth pin and the first pin form a loop having an impedance matched with the identification resistance of the mobile terminal, and the third pin and the first pin form a loop having an impedance matched with the identification resistance of the mobile terminal. When the second unidirectional conduction module is turned on, the fourth pin and the second pin form a loop having an impedance matched with the identification resistance of the mobile terminal, and the third pin and the second pin form a loop having an impedance matched with the identification resistance of the mobile terminal.

Furthermore, each of the first matching circuit and the second matching circuit comprises a resistor, a loudspeaker, a transformer, a resistor and a comparator connected in parallel, or a resistor and an operational amplifier connected in parallel.

Furthermore, each of the first unidirectional conduction module, the second unidirectional conduction module, the third unidirectional conduction module and the fourth unidirectional conduction module comprises a diode, a triode or a MOS transistor.

Furthermore, the first circuit further comprises a first matching module connected with the first unidirectional conduction module, the second circuit further comprises a second matching module connected with the second unidirectional conduction module, the third circuit further comprises a third matching module connected with the third unidirectional conduction module, and the fourth circuit further comprises a fourth matching module connected with the fourth unidirectional conduction module.

Furthermore, each of the first matching module, the second matching module, the third matching module and the fourth matching module comprises a resistor, a loudspeaker, a transformer, a resistor and a comparator connected in parallel, or a resistor and an operational amplifier connected in parallel.

Furthermore, the first pin and the second pin of the audio interface are connected via a bidirectional conduction element.

Structures of the first circuit and the second circuit may be the same as or different from each other, and structures of the third circuit and the fourth circuit may be the same as or different from each other.

Structures of the first matching circuit and the second matching circuit may be the same as or different from each other.

Embodiment 6

Embodiments of the present disclosure further provide an electronic signature token comprising the device for matching with an audio interface of a mobile terminal according to the above embodiments.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases such as "in an embodiment," "in some embodiments," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments of the present disclosure have been shown and described, it would be appreciated by those skilled in the art that changes, modifications, alternatives, and variations can be made in the embodiments without departing from the spirit, principles and scope of the present disclosure, and the scope of the present disclosure is defined by the claims and equivalents thereof.

What is claimed is:

1. A method for matching with an audio interface of a mobile terminal, the audio interface of the mobile terminal comprising a first pin, a second pin and a third pin, the first pin being one of a microphone pin and a ground pin, the second pin being the other one of the microphone pin and the ground pin, and the third pin being a single-channel audio output pin or one of multichannel audio output pins, wherein the method comprises following steps:

connecting the third pin with the first pin via a first circuit, in which the first circuit comprises a first unidirectional conduction module having a current direction of flowing to the first pin;

connecting the third pin with the second pin via a second circuit, in which the second circuit comprises a second unidirectional conduction module having a current direction of flowing to the second pin;

controlling the first unidirectional conduction module to turn on such that the third pin and the first pin form a first loop having an impedance matched with an identification resistance of the mobile terminal; and controlling the second unidirectional conduction module to turn on such that the third pin and the second pin form a second loop having an impedance matched with the identification resistance of the mobile terminal.

2. The method according to claim 1, further comprising:
connecting the third pin with the first circuit and the second circuit respectively via a first matching circuit;

controlling the first unidirectional conduction module to turn on such that the third pin and the first pin form a third loop having an impedance matched with the identification resistance of the mobile terminal; and controlling the second unidirectional conduction module to turn on such that the third pin and the second pin form a fourth loop having an impedance matched with the identification resistance of the mobile terminal.

3. The method according to claim 2, wherein the audio interface further comprises a fourth pin being the other one of the multichannel audio output pins, and the method further comprises:

connecting the fourth pin with the first circuit and the second circuit respectively via a second matching circuit;

controlling the first unidirectional conduction module to turn on such that the fourth pin and the first pin form a seventh loop having an impedance matched with the identification resistance of the mobile terminal, and such that the third pin and the first pin form an eighth loop having an impedance matched with the identification resistance of the mobile terminal; and controlling the second unidirectional conduction module to turn on such that the fourth pin and the second pin form a ninth loop having an impedance matched with the identification resistance of the mobile terminal, and such that the third pin and the second pin form a tenth loop having an impedance matched with the identification resistance of the mobile terminal.

4. The method according to claim 3, wherein each of the first matching circuit and the second matching circuit comprises a resistor, a loudspeaker, a transformer, a resistor and a comparator connected in parallel, or a resistor and an operational amplifier connected in parallel.

5. The method according to claim 1, wherein the audio interface further comprises a fourth pin being the other one of the multichannel audio output pins, and the method further comprises:

connecting the fourth pin with the first pin via a third circuit, in which the third circuit comprises a third unidirectional conduction module having a current direction of flowing to the first pin;

connecting the fourth pin with the second pin via a fourth circuit, in which the fourth circuit comprises a fourth unidirectional conduction module having a current direction of flowing to the second pin;

controlling the third unidirectional conduction module to turn on such that the fourth pin and the first pin form a fifth loop having an impedance matched with the identification resistance of the mobile terminal; and controlling the fourth unidirectional conduction module to turn on such that the fourth pin and the second pin form a sixth loop having an impedance matched with the identification resistance of the mobile terminal.

6. The method according to claim 5, wherein each of the first unidirectional conduction module, the second unidirectional conduction module, the third unidirectional conduction module and the fourth unidirectional conduction module comprises a diode, a triode or a MOS transistor.

7. The method according to claim 5, wherein the first circuit further comprises a first matching module connected with the first unidirectional conduction module, the second circuit further comprises a second matching module connected with the second unidirectional conduction module, the third circuit further comprises a third matching module connected with the third unidirectional conduction module, and the fourth circuit further comprises a fourth matching module connected with the fourth unidirectional conduction module.

8. The method according to claim 7, wherein each of the first matching module, the second matching module, the third matching module and the fourth matching module comprises a resistor, a loudspeaker, a transformer, a resistor and a comparator connected in parallel, or a resistor and an operational amplifier connected in parallel.

9. The method according to claim 1, wherein the first pin and the second pin of the audio interface are connected via a bidirectional conduction element.

10. A device for matching with an audio interface of a mobile terminal, wherein the audio interface of the mobile terminal comprises a first pin, a second pin and a third pin, the first pin is one of a microphone pin and a ground pin, the second pin is the other one of the microphone pin and the ground pin, and the third pin is a single-channel audio output pin or one of multichannel audio output pins, and the device comprises:

a first circuit via which the third pin and the first pin are connected, the first circuit comprising a first unidirectional conduction module; and a second circuit via which the third pin and the second pin are connected, the second circuit comprising a second unidirectional conduction module; in which a current direction of the first unidirectional conduction module is to flow to the first pin, a current direction of the second unidirectional conduction module is to flow to the second pin;

when the first unidirectional conduction module is turned on, a first loop is formed by the third pin and the first pin, and the first loop has an impedance matched with an identification resistance of the mobile terminal; and when the second unidirectional conduction module is turned on, a second loop is formed by the third pin and the second pin, and the second loop has an impedance matched with the identification resistance of the mobile terminal.

11. The device according to claim 10, further comprising:
a first matching circuit via which the third pin is connected with the first circuit and the second circuit respectively; wherein when the first unidirectional conduction module is turned on, a third loop is formed by the third pin and the first pin, and the third loop has an impedance matched with the identification resistance of the mobile terminal; and when the second unidirectional conduction module is turned on, a fourth loop is formed by the third pin and the second pin, and the fourth loop has an impedance matched with the identification resistance of the mobile terminal.

12. The device according to claim 11, wherein the audio interface further comprises a fourth pin being the other one of the multichannel audio output pins, and the device further comprises:
   a second matching circuit via which the fourth pin is connected with the first circuit and the second circuit respectively; in which
   when the first unidirectional conduction module is turned on, a seventh loop is formed by the fourth pin and the first pin, an eighth loop is formed by the third pin and the first pin, the seventh loop has an impedance matched with the identification resistance of the mobile terminal, and the eighth loop has an impedance matched with the identification resistance of the mobile terminal; and
   when the second unidirectional conduction module is turned on, a ninth loop is formed by the fourth pin and the second pin, an tenth loop is formed by the third pin and the second pin, the ninth loop has an impedance matched with the identification resistance of the mobile terminal, and the tenth loop has an impedance matched with the identification resistance of the mobile terminal.

13. The device according to claim 12, wherein each of the first matching circuit and the second matching circuit comprises a resistor, a loudspeaker, a transformer, a resistor and a comparator connected in parallel, or a resistor and an operational amplifier connected in parallel.

14. The device according to claim 10, wherein the audio interface further comprises a fourth pin being the other one of the multichannel audio output pins, and the device further comprises:
   a third circuit via which the fourth pin and the first pin are connected, the third circuit comprising a third unidirectional conduction module; and
   a fourth circuit via which the fourth pin and the second pin are connected, the fourth circuit comprising a fourth unidirectional conduction module; in which
   a current direction of the third unidirectional conduction module is to flow to the first pin, and a current direction of the fourth unidirectional conduction module is to flow to the second pin;
   when the third unidirectional conduction module is turned on, a fifth loop is formed by the fourth pin and the first pin, and the fifth loop has an impedance matched with the identification resistance of the mobile terminal; and
   when the fourth unidirectional conduction module is turned on, a sixth loop is formed by the fourth pin and the second pin, and the sixth loop has an impedance matched with the identification resistance of the mobile terminal.

15. The device according to claim 14, wherein each of the first unidirectional conduction module, the second unidirectional conduction module, the third unidirectional conduction module and the fourth unidirectional conduction module comprises a diode, a triode or a MOS transistor.

16. The device according to claim 14, wherein the first circuit further comprises a first matching module connected with the first unidirectional conduction module, the second circuit further comprises a second matching module connected with the second unidirectional conduction module, the third circuit further comprises a third matching module connected with the third unidirectional conduction module, and the fourth circuit further comprises a fourth matching module connected with the fourth unidirectional conduction module.

17. The device according to claim 16, wherein each of the first matching module, the second matching module, the third matching module and the fourth matching module comprises a resistor, a loudspeaker, a transformer, a resistor and a comparator connected in parallel, or a resistor and an operational amplifier connected in parallel.

18. The device according to claim 10, wherein the first pin and the second pin of the audio interface are connected via a bidirectional conduction element.

19. The device according to claim 10, wherein the mobile terminal is a mobile phone.

20. An electronic signature token comprising the device for matching with an audio interface of a mobile terminal according to claim 10.

* * * * *